United States Patent [19]

Sekiguchi

[11] Patent Number: 5,936,891
[45] Date of Patent: Aug. 10, 1999

[54] NON-VOLATILE SEMICONDUCTOR MEMORY DEVICE

[75] Inventor: Mitsuru Sekiguchi, Tokyo, Japan

[73] Assignee: NEC Corporation, Tokyo, Japan

[21] Appl. No.: 09/120,742

[22] Filed: Jul. 23, 1998

[30] Foreign Application Priority Data

Jul. 25, 1997 [JP] Japan .................................. 9-216022

[51] Int. Cl.$^6$ ................................................ G11C 7/00
[52] U.S. Cl. ............................ 365/185.26; 365/185.27; 365/185.18; 365/189.09
[58] Field of Search .................. 365/185.26, 185.27, 365/185.29, 185.18, 189.09

[56] References Cited

U.S. PATENT DOCUMENTS

| | | | |
|---|---|---|---|
| 4,425,632 | 1/1984 | Iwahshi et al. | 365/189.09 |
| 5,483,485 | 1/1996 | Maruyama | 365/185.19 |
| 5,521,864 | 5/1996 | Kobayashi et al. | 365/185.22 |

FOREIGN PATENT DOCUMENTS

3-219721  9/1991  Japan .

Primary Examiner—Vu A. Le
Attorney, Agent, or Firm—Sughrue, Mion, Zinn, Macpeak & Seas, PLLC

[57] ABSTRACT

It is an object of the invention to provided an electrically erasable and programmable non-volatile semiconductor memory device, in which misread of a datum stored in a memory cell can be avoided by suppressing floating of the potentials of a memory cell source wire and a word wire in case that the operation of the memory device shifts from erasing pulse application to erase verify. Two transistors with different current-driving capabilities are connected in parallel and inserted between the memory cell source wire and the ground plane. When the operation of the memory device shifts from erasing pulse application to erase verify, a N-type transistor with lower current-driving capability turns on at fist, thereby the potential of the memory cell source wire is slowly reduced, and the other transistor with higher current-driving capability turns on afterward. After the memory cell source wire is connected with the ground plane and its potential is perfectly stabilized, the datum stored in the memory cell can be normally read.

6 Claims, 7 Drawing Sheets

M00 – Mmn : MEMORY CELLS
W0,W1,Wm : WORD WIRES
d0,d1,dn : BIT WIRES
ERASE : ERASE ACTIVATION SIGNAL
ERASE2 : CONTROL SIGNAL

MN1 : N-TYPE TRANSISTOR
MN2 : N-TYPE TRANSISTOR
MP1 : P-TYPE TRANSISTOR
Cs : PARASITIC CAPACITOR

FIG.1 PRIOR ART

301: DATA INPUT OUTPUT TERMINAL
302: Vpp TERMINAL
303: CE TERMINAL
304: OE TERMINAL
305: ADDRESS TERMINAL
306: ADDRESS BUFFER
307: I/O BUFFER
308: WRITE CIRCUIT
309: SENSE AMPLIFIER
310: Y SELECTING TRANSISTORS
311: X DECODER
312: MEMORY CELL ARRAY
313: CONTROL CIRCUIT
Ai,Aj: SELECTED ADDRESS OF WORD WIRE
Ak,Al: SELECTED ADDRESS OF BIT WIRE

FIG.2 PRIOR ART

M00 – Mmn : MEMORY CELL
W0,W1,Wm : WORD WIRES
d0,d1,dn : BIT WIRES
$\overline{ERASE}$ : ERASE ACTIVATION SIGNAL
MN1 : N-TYPE TRANSISTOR
MP1 : P-TYPE TRANSISTOR
Cs : PARASITIC CAPACITOR

M00 – Mmn : MEMORY CELLS
W0,W1,Wm : WORD WIRES
d0,d1,dn : BIT WIRES
$\overline{ERASE}$ : ERASE ACTIVATION SIGNAL
$\overline{ERASE2}$ : CONTROL SIGNAL MN1 : N-TYPE TRANSISTOR
MN2 : N-TYPE TRANSISTOR
MP1 : P-TYPE TRANSISTOR
Cs : PARASITIC CAPACITOR

MOO – Mmn : MEMORY CELLS
W0,W1,Wm : WORD WIRES
d0,d1,dn : BIT WIRES
ERASE : ERASE ACTIVATION SIGNAL
ERASE2 : CONTROL SIGNAL

MN1 : N-TYPE TRANSISTOR
MN2 : N-TYPE TRANSISTOR
MP1 : P-TYPE TRANSISTOR
Cs : PARASITIC CAPACITOR

FIG. 7

NON-VOLATILE SEMICONDUCTOR MEMORY DEVICE

FIELD OF THE INVENTION

The invention relates to an electrically erasable and programmable non-volatile semiconductor memory device, and especially to an erasing circuit used therein.

BACKGROUND OF THE INVENTION

In general, when all the memory cells of an electrically erasable and programmable non-volatile semiconductor memory device are collectively erased data of "0" are written into them in advance in order to equalize their threshold levels. Then, a high voltage is applied to a memory cell source wire, which is connected with the respective memory cell sources, in order to erase the data stored in them. Subsequently, the application of high voltage to the memory cell source wire is stopped, and whether all the memory cells are erased or not is discriminated, which is called "erase verify". When the operation of the memory device shift's from a high voltage application to erase verify, the memory cell is connected with the ground plane via a switching transistor with high current driving capability in most cases. However, the potential of the memory cell source wire sinks under the ground potential for a short time after the switching transistor turns on. Consequently, the potential of the word wires, which are capacitively coupled with the memory cell source wire sinks under the ground potential also. Since the word wires are respectively connected with the gates of the cell transistors, the step of erase very becomes unstable. The aforementioned high voltage is applied to the memory cell source wire in the form of pulse, and the non-volatile semiconductor device is provided with a memory cell erasing circuit in usual.

SUMMARY OF THE INVENTION

Accordingly, it is an object of the invention to provide a non-volatile semiconductor memory device, in which the situation that, the potential of the word wire sinks under the ground potential and thereby the datum stored in the memory cell is misread, can be avoided, when the operation of the erasing circuit shifts from the erasing pulse application to erase verify in the process of automatic erasing.

According to the feature of the invention, a non-volatile semiconductor device comprises:

a memory cell array composed of plural electrically erasable and programmable memory cells, and plural switching transistors, which are respectively inserted between a memory cell source wire and aground plane, and have different current-driving capabilities, wherein the switching transistors turn on in an inverse order of their current-driving capabilities, in case that a potential of the memory cell source wire is reduced from a high potential to a ground potential.

BRIEF DESCRIPTION OF THE DRAWINGS

The invention will be explained in more detail in conjunction witH appended drawings, wherein.

DESCRIPTION OF THE PREFERRED EMBODIMENT

Before explained a non-volatile semiconductor memory device in the preferred embodiment according to the invention, the aforementioned conventional non-volatile semiconductor memory device will be explained.

Figure 1:
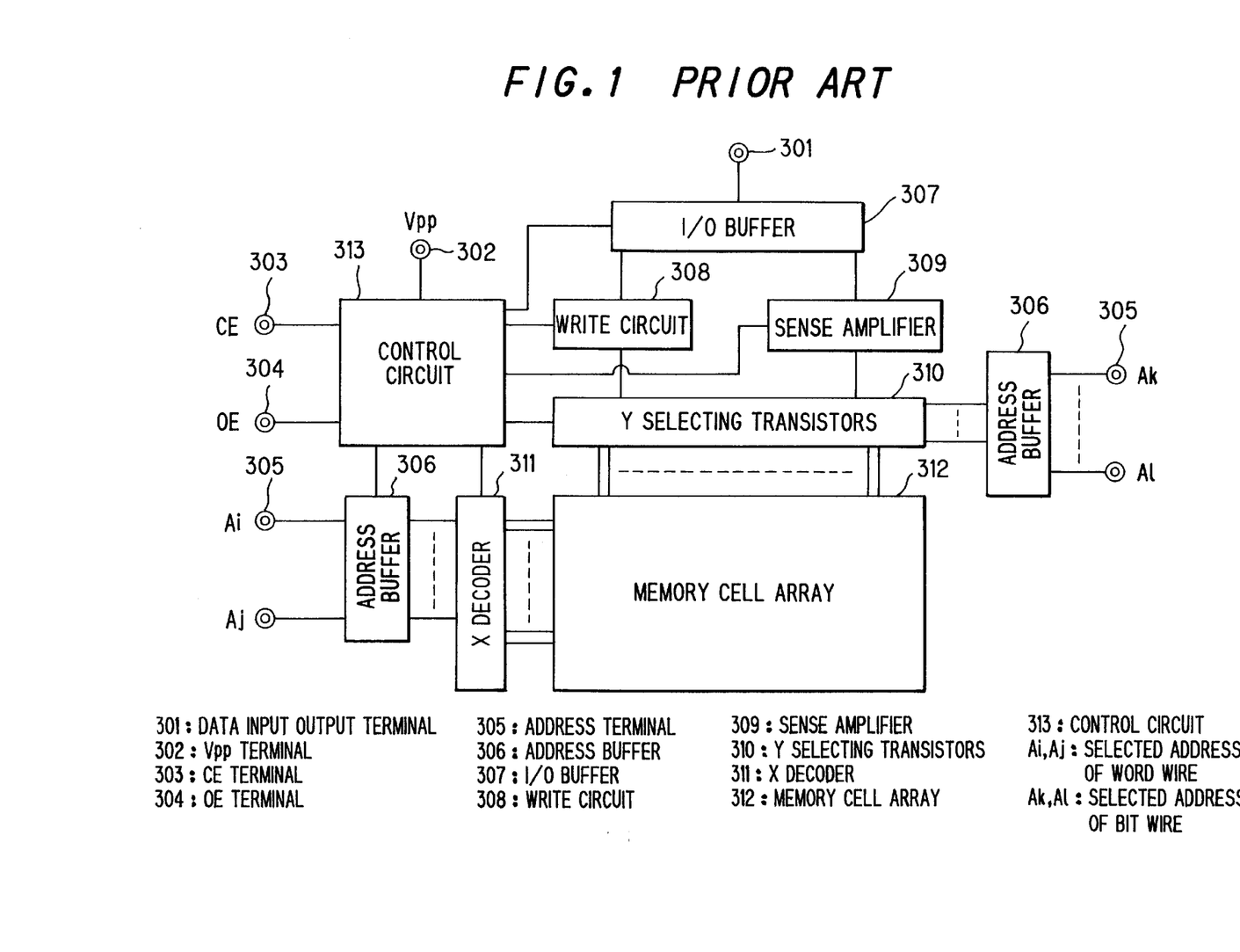
FIG. 1 is a block diagram for showing a structure of a conventional non-volatile semiconductor memory device.

FIG. 1 shows the outline of the structure of a conventional on-volatile semiconductor memory device. First, the functions of the structural elements of the non-volatile semiconductor memory device shown in FIG. 1 will be explained. A memory cell array 312 stores data supplied from the outside. An address buffer 306 is supplied with external address signals and generates internal address signals. A X decoder 311 selects a word wire Xn in accordance with the internal address signals generated by the address buffer 306. Y-selecting transistors 310 selects a bit wire in accordance with an address signal. A sense amplifier 309 amplifiers a datum stored in a memory cell selected by the X decoder 311 and the Y-selecting transistors 310. An I/O buffer 307 supplies the output of the sense amplifier 309 to data input and output terminals. A write circuit 308 writes data supplied from the input and output terminal 301 into a memory cell, which is selected by the X decoder 311 and the Y-selecting transistors 310. A control circuit 313 is supplied with chip enable signals, output enable signals and the output of a power supply for write (a power supply for VPP) and generates internal control signals, which controls the operations of the address buffer 306, the X decoder 311, the Y-selecting transistors 310, the sense amplifier 309, the write circuit 308 and the I/O buffer 307.

Next, the operation of automatic erasion of a conventional flash EEPROM (electrically erasable and programmable read only memory) will be explained.

Generally speaking, in a flash memory, which is electrically erasable in the lump, there is a problem that a memory cell is over erased on account of the structure of the memory device and the method for erasing the same, and a threshold level of the memory cell becomes negative, in other word, is in depletion condition. In order to solve this problem, before the memory cells are erased, data of "0" are written into all the memory cells and their threshold levels are equalized. Then, a high voltage is applied between gates and sours of memory cell transistors, electric charge stored on floating gates at the time of write are extracted by Fowler-Nordheim phenomenon, and thereby the memory cells are erased.

In order to avoid the situation that the memory cells are over erased, the memory cells are erased according to the following process.

The width of a high voltage pulse for erasing the memory cell (a erasing pulse, hereinafter) is made to be narrower than that necessary for erasing the memory cell, and each time the narrow pulse is applied to all the memory cells, the data stored in all the memory cells are read, and whether all the memory cells in the memory cell array are erased or not is confirmed.

Even if only one memory, in which a datum is not yet erased, is still existent, the aforementioned erasing pulse with the narrow width is again applied to the source wire.

It is called erase verify ("erase inspection") to confirm whether all the data stored in the memory cells are erased or not, and erase verify and the application of erasing pulse to the source wire are alternately repeated till all the memory cells in the memory cell array are erased.

After the memory cells are erased, whether the over erased memory cells are existent or not is confirmed ("erase inspection"). If no over erased memory cell is existent, data for notifying that erase is completed are supplied to the outside of the memory device, and the process of erase is over. In case that an over erased memory cell is existent, soft writing is carried out into the memory cells lying along the same bit wire, on which the aforementioned over erased memory cell exists, and their threshold levels recover themselves so that data can be normally written into the aforementioned memory cells. Then, erase verify 2 ("erase inspection") is again carried out at a level, which is slightly higher than that in the case of erase verify ("erase inspection"), and if all the memory cells are in erased condition, erase is completed by supplying data, which notifying that erase is over, to the outside of the memory device.

A series of operations mentioned in the above, "initial writing", "erase", "erase inspection, and", are automatically carried out.

Figure 2:
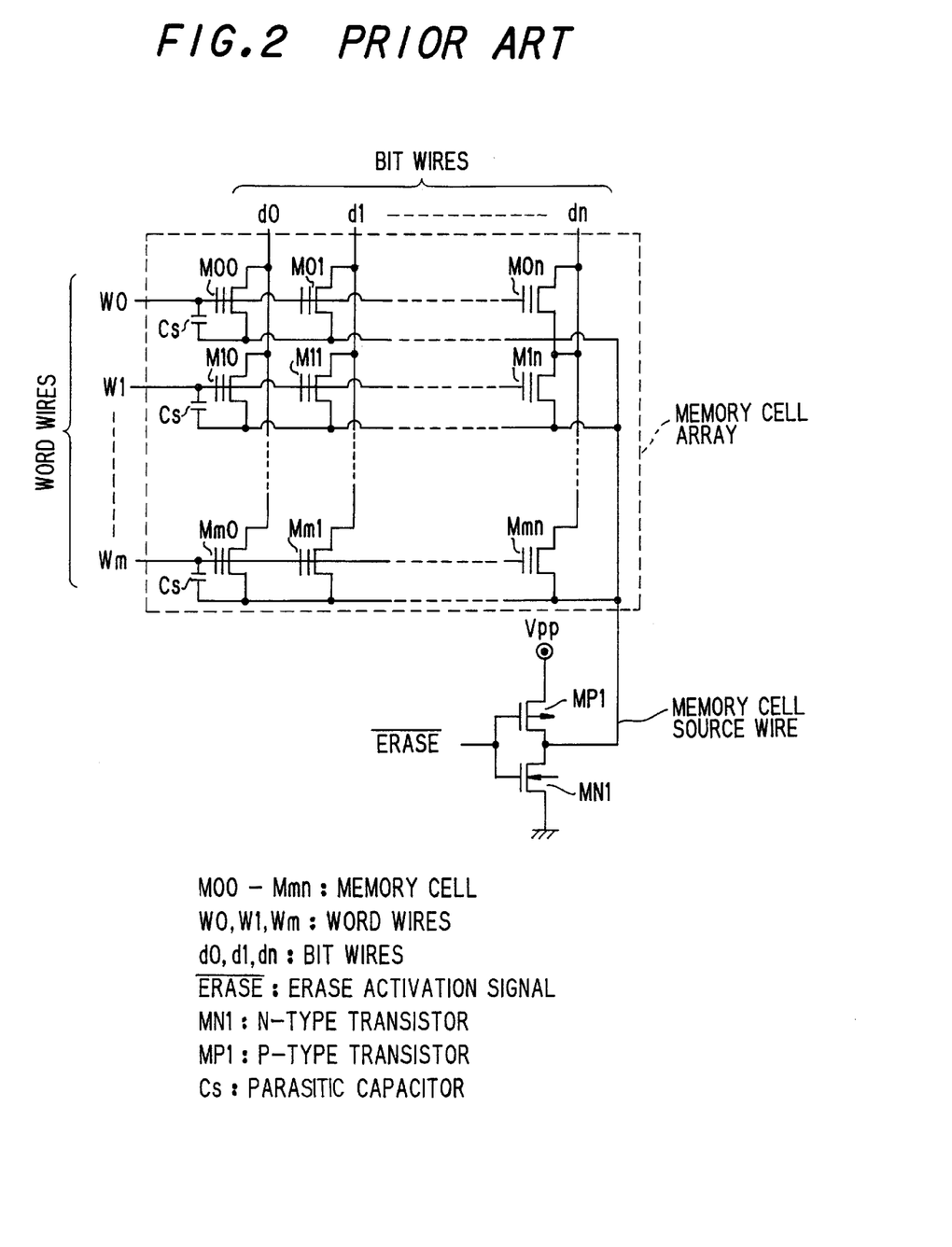
FIG. 2 shows a conventional erasing pulse application circuit.
Figure 3:
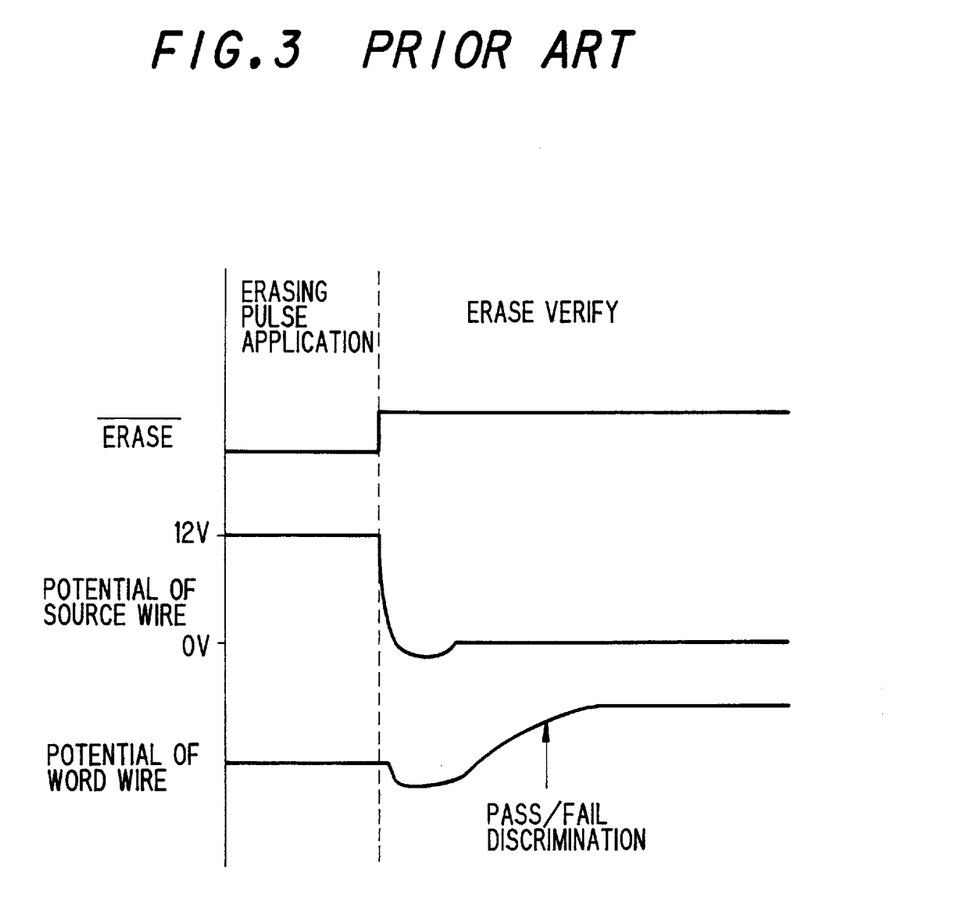
FIG. 3 shows schematic representations of control signals and potentials of wires connected with a cell transistor in the conventional erasing pulse application circuit.

FIG. 2 shows a conventional erasing pulse application circuit for a non-volatile semiconductor memory device, and FIG. 3 shows the behaviors of signal voltages in the time domain for explaining the operation of the erasing circuit shown in FIG. 2. In FIG. 2, W0, w1 and Wm are word wires, d0, d1, dn are bit wires, M00–Mmn are memory cell transistors of floating gate type, ERASE is a erase activation signal, MN1 is a N-type transistor, MP1 is a P-type transistor, Cs is a parasitic capacitor and VPP is a high voltage for erasing memory cell.

While the erasing pulse is applied, the erase activation signal ERASE is L, the N-type transistor MN1 turns off, the P-type transistor MP1 turns on, and the high voltage VPP is applied to the memory cell source wire.

While the erasing pulse is not applied, the erase activation signal ERASE is "H", and the memory cell source wire is at ground potential. In this circuit, the current driving-capability of the N-type transistor MN1 is so high that floating of the potential of the source of the memory cell transistor can be suppressed.

In the technology disclosed in Japanese Patent kokai 3-219721, a switching circuit for suppressing noise generated in an output buffer is proposed, although it is not related to the erasing circuit for the non-volatile semiconductor memory device. In this switching circuit, plural field effect transistors are inserted between an output terminal and a power supply, and timings of their on-off operations are successively shifted in accordance with operating signals generated by an operating circuit.

However, following problems have been pointed out on the aforementioned conventional technologies.

The first problem is that, in the aforementioned erasing circuit of the non-volatile semiconductor memory device, when the operation of the erasing circuit in the process of automatic erase is shifted from erasing pulse application to erase verify, the memory cell may be misread, because the potential of the gate of the memory cell is not settled within a desired time.

The reason for the aforementioned phenomenon is that, as shown in FIG. 3, when the operation of the erasing circuit shifts from erasing pulse application to erase verify, the potential of the memory cell is suddenly reduced from a high potential to the ground potential, and thereby the potential of the source wire sinks under the ground potential. Consequently, the potential of the word wire, which is capacitively coupled with the source wire, sinks under the ground potential also, and is not settled in adesired potential within a desired time.

The second problem is that the memory cell is over erased (brought to "depletion condition") on account of the first problem mentioned in the above.

The reason for the aforementioned fact is that, since the potential of the word wire sinks under the ground potential for a short time, a memory cell, which has been already erase, is misguidedly regarded as not erased, and erasing pulse application is repeated.

Next, the preferred embodiment of the invention will be explained. The erasing circuit of a non-volatile semiconductor memory device according to the invention are provide with the first transistor MN1 and the second transistor MN2, and the current-driving capability of the first transistor MN1 is higher than that of the second transistor MN2. These transistors are connected in parallel with each other, and inserted between the memory cell source wire and the ground plane. While the memory cells are being erased, a high voltage VPP for erasing the memory cells are applied to the memory cell source wire. When the operation of the erasing circuit shifts to erase verify, the high voltage VPP for erasing the memory cell is not applied to the memory cell source wire, and the second transistor MN2 turns on, and the potential of the memory cell source wire is slowly reduced toward the ground potential. When a predetermined time has passed after the second transistor MN2 turns on, the first transistor MN1 turns on.

Figure 4:
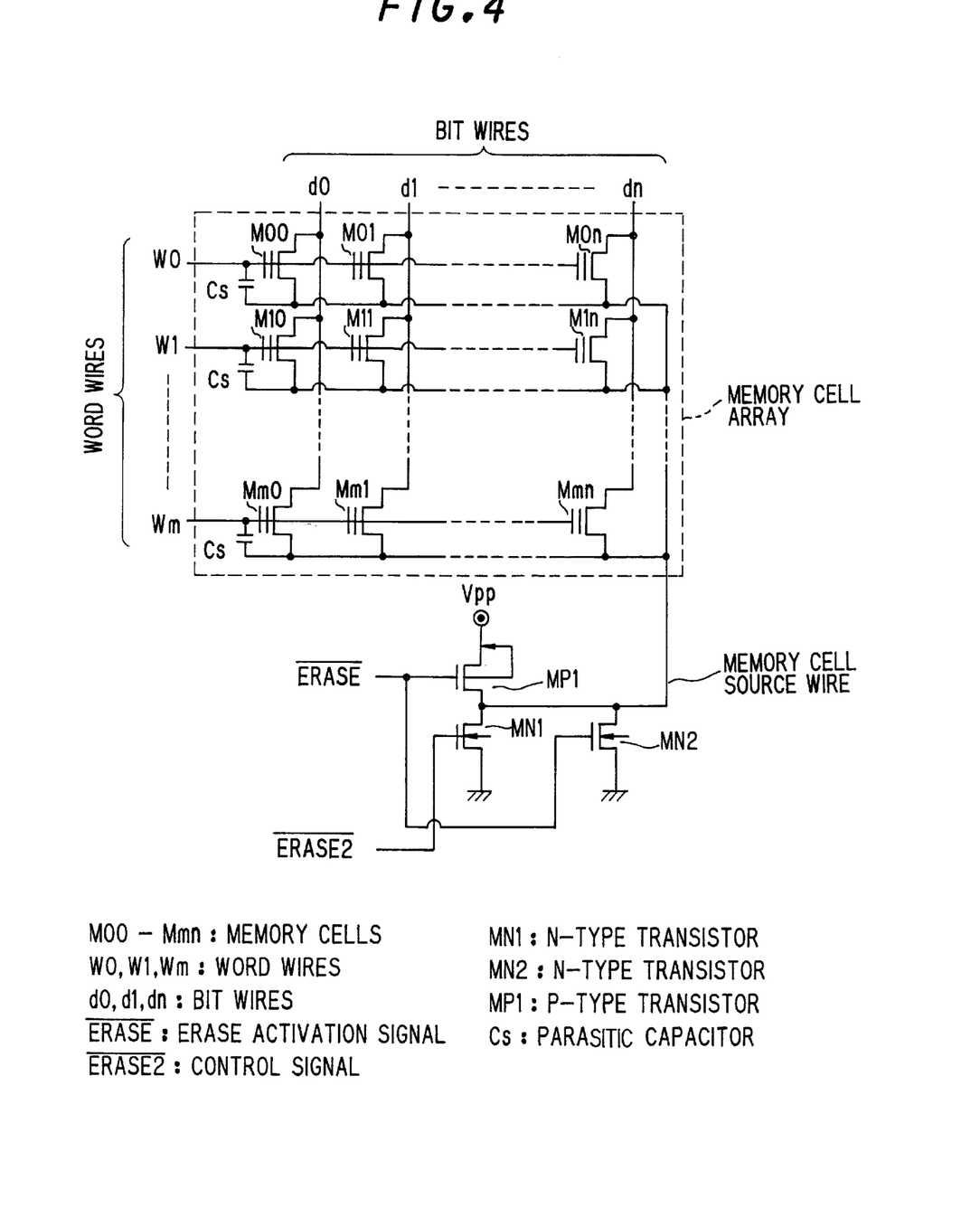
FIG. 4 shows a structure of the first preferred embodiment of the invention.

That is to say, the feature of the invention is that, when the operation of the erasing circuit shifts from erasing pulse application to erase verify, the potential of the memory cell source wire is lowly reduced from VPP to the ground potential by using the transistor with lower current-driving capability (MN2 in FIG. 4) and the transistor with higher current-driving capability (MN1 in FIG. 4).

In the embodiment of the invention, when the potential of the memory cell source is reduced in case that the operation of the erasing circuit shown in FIG. 4 sifts to erase verify, the transistor with lover current-driving capability (MN2 in FIG. 4) turns on, before the transistor with higher current-driving capability (MN1 in FIG. 4) turns on. Accordingly, the potential of the memory cell source is slowly reduced, and the situation that the potential of the word wire sinks under the ground potential can be avoided. As a result misread and over erase caused thereby can be prevented.

In order to explain the embodiments of the invention more detail, the embodiment of the invention will be explained referring to the appended drawings.

FIG. 4 shows a circuit structure of the first preferred embodiment of the invention. In FIG. 4, M00 to Mmn are memory cell transistors of floating gate type, d0 to dn are bit wires connected with drains of plural memory cell transistors, w0 to Wm are word wires connected with gates of the plural memory cell transistors. VPP is a power supply for erasing the memory cells, MP1 is a P-type field effect transistor, the drain of which is connected with a common source wire for the plural memory cells, MN1 is a N-type field effect-transistor, the drain of which is connected with the common source wire of the plural memory cells, and MN2 is a N-type field effect transistor, which has a drain connected with the common source wire of the plural memory cells and a lower current-driving capability than that of the N-type transistor MN1. The gates of the P-type transistor MP1 and the N-type transistor MN2 are supplied with a erase activation signal ERASE, and the gate of the N-type transistor MN1 is supplied with a control signal ERASE2.

Figure 5:
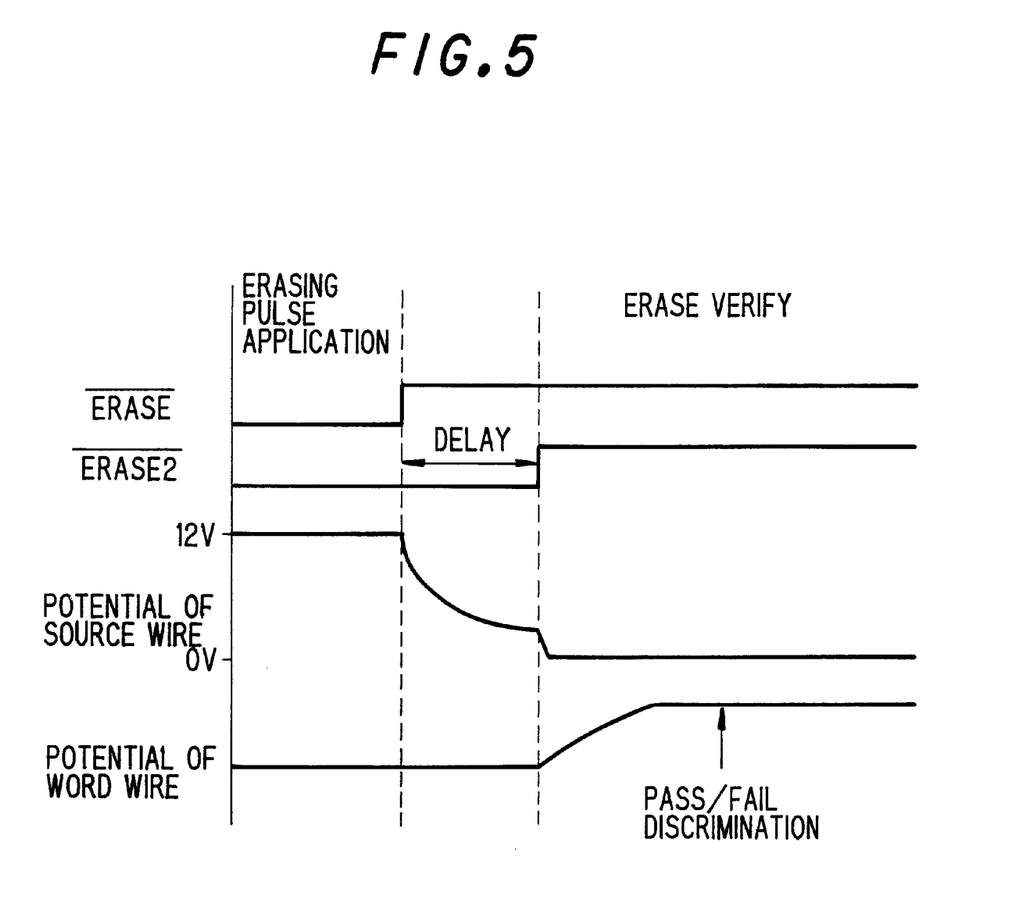
FIG. 5 shows a schematic representation of control signals and potentials of wires connected with a cell transistor in an erasing pulse application circuit of the first preferred embodiment of the invention.

FIG. 5 shows a schematic representation of signal voltages for explaining the operation of the preferred embodiment of the invention. FIG. 5 shows control signals, ERASE and ERASE2, and potentials of the memory cell source and word wire, when the operation of the erasing circuit shown in FIG. 4 continues from erasing pulse application to erase verify Then, the operations of the embodiment of the invention will be explained over the steps of erasing pulse application and erase verify referring to FIGS. 4 and 5.

While data stored in memory device are being erased, the erasing pulse control signal (the erase activation signal) ERASE is made to be "L", the control signal ERASE2 is made to be "L", the N-type transistors NM1 and NM2 turn off and the P-type transistor MP1 turns on; and a voltage VPP for erasing the memory cells is applied to the common source wire of the pulse memory cells.

When the operation of the erasing circuit shifts from erasing pulse application to erase verify, the erasing pulse control signal ERASE is made to be "H", the P-type transistor MP1 turn of, and the voltage for erasing the memory cells is not applied to the common source wire of the plural memory cells. At the same time, the N-type transistor MN2 with lower current-driving capability turns on, and the potential of the memory cell source wire is slowly reduced towards the ground potential.

Next, after a predetermined time has passed, ERASE2 is made to be "H", and the N-type transistor MN1 with higher current-driving capability turns on, and reduces the potential of the memory cell source wire, which has not yet been perfectly reduced by the N-type transistor MN2, down to the ground potential. Then, the step of erase verify is started.

Figure 6:
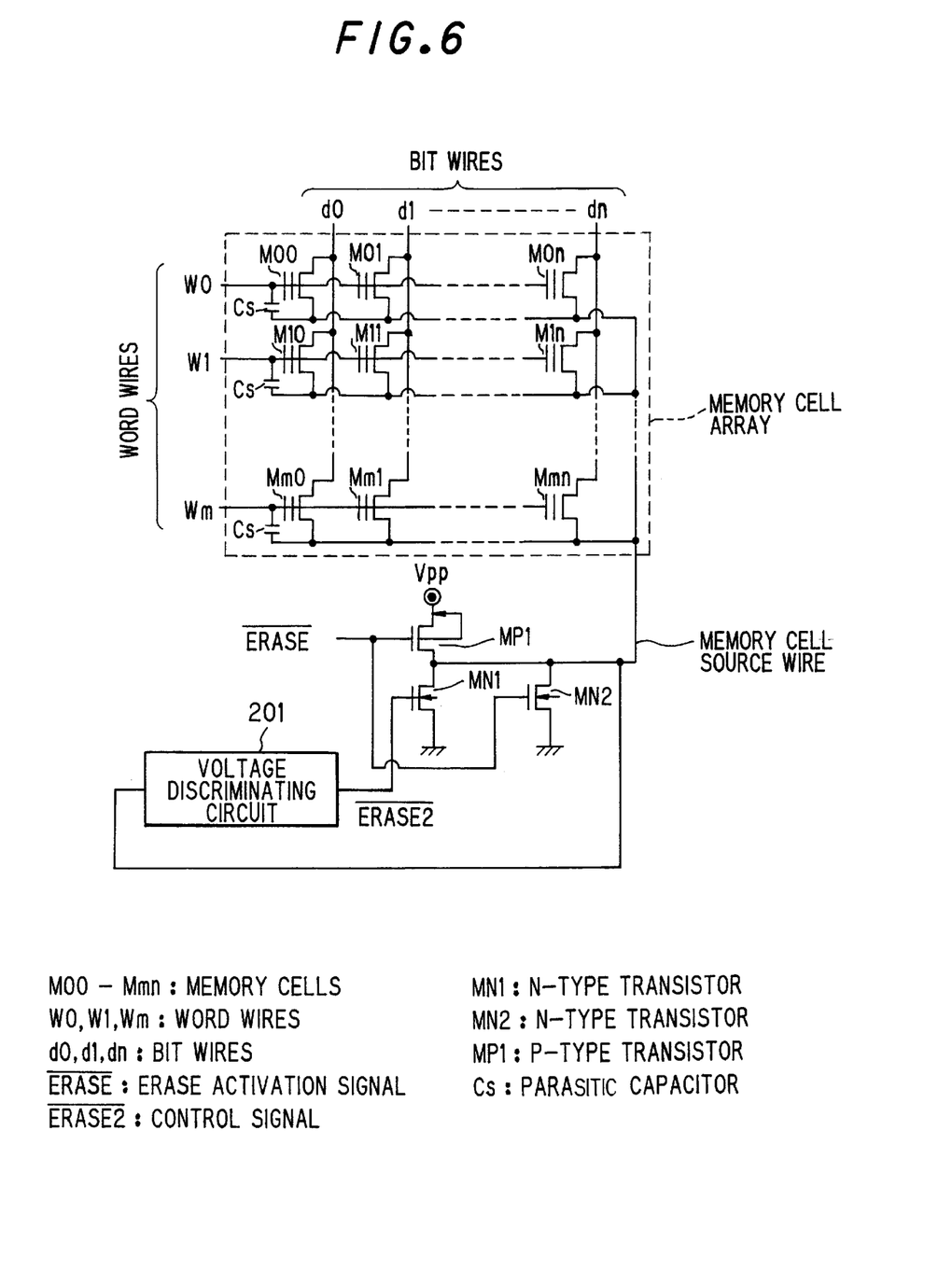
FIG. 6 shows a structure of the second preferred embodiment of the invention.
Figure 7:
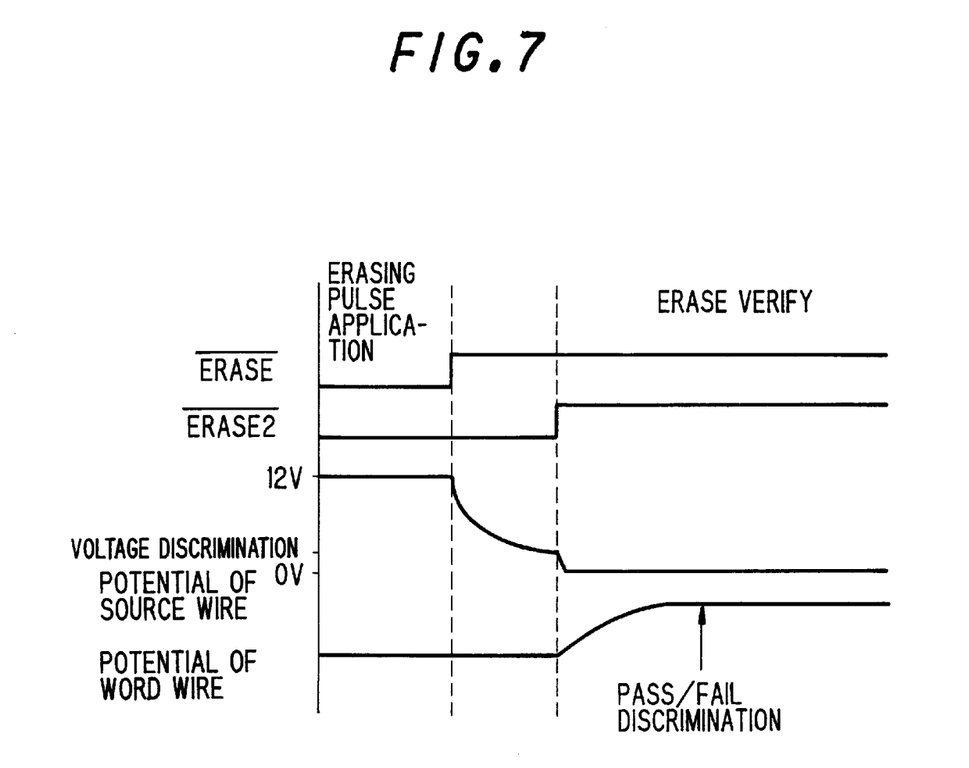
FIG. 7 shows a schematic representation of control signals and potentials of wires connected with a cell transistor in an erasing pulse application circuit of the second preferred embodiment of the invention.

Next, the second preferred embodiment of the invention will be explained. FIG. 6 shows the structure of the second preferred embodiment of the invention. In FIG. 6, structural elements with the same functions as those showing FIG. 4 are denoted by the same reference numerals. As shown in FIG. 6, the fundamental structure of this embodiment is similar to that of the first preferred embodiment, but the difference therebetween is that this embodiment is provided with a voltage-discriminating circuit 201, which discriminates the potential of the memory cell source wire and supplied a control signal ERASE2 to the gate of the N-type transistor MN1. FIG. 7 shows schematic representations of the signal voltages for explaining the operation of this embodiment.

When the operation of the embodiment shifts from erasing pulse application to erase verify, a P-type transistor MP1 turns off, and at the same time, a N-type transistor MN2 with lower current-driving capability turns on, and the potential of the memory cell source wire is slowly reduced towards the ground potential. When the potential of the memory cell wire is equal to the predetermined potential, ERASE2 is activated by the voltage discriminating circuit 201, and the N-type transistor Mn1 with higher current-driving capability turns on. Then, the potential of the memory source wire is reduced down to the ground potential, and the step of erase verify is started.

As mentioned in the above, according to the invention, when the operation of the erasing circuit shifts from erasing pulse application to erase verify, the potential of the memory cell source wire is slowly reduced, so that misread of the memory cells and over erase caused by misread can be prevented.

The reason for the aforementioned fact is that the situation that the potential of the source wire sinks under the ground potential can be avoided by slowly reducing the potential of the memory source wire, and similarly the potential of the word wire, which is capacitively coupled with the source wire, does not sink under the ground potential. Then, the operation of the memory cell can be stabilized, and the datum stored in the memory cell can be normally read.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A non-volatile semiconductor memory device comprising:

a memory cell array composed of plural electrically erasable and programmable memory cells, and plural switching transistors, which are respectively inserted between a memory cell source wire and a ground plane, and have different current-driving capabilities, wherein said switching transistors turn on in an inverse order of their current-driving capabilities, in case that a potential of said memory cell source wire is reduced from a high potential to a ground potential.

2. A non-volatile semiconductor memory device according to claim 1, wherein:

a number of said switching transistor is two, said switching transistor with lower current-driving capability turns on at first, and said switching transistor with higher current-driving capability turns on afterward.

3. A non-volatile semiconductor memory device according to claim 2, wherein:

said switching transistor with higher current-driving capability turns on, when a predetermined time has passed after said switching transistor with lower current-driving capability turned on.

4. A non-volatile semiconductor memory device according to claim 2, wherein:

said switching transistor with higher current-driving capability turns on, when said potential of said memory cell source wire becomes equal to a predetermined value.

5. A non-volatile semiconductor memory device comprising:

a memory cell array composed of plural electrically erasable and programmable memory cells, first and second switching transistors respectively connected with a memory cell source wire and a ground plane in parallel with each other, a current-driving capability of said first switching transistor being higher than that of said second switching transistor, wherein a high potential is applied to a memory cell source wire, while said memory cells are being erased, means for making said second switching transistor turn on at a point of time that said application of said high potential to said memory cell source wire is stopped, and means for making said first switching transistor turn on at a point of time that a predetermined time has passed after said second switching transistor turned on, wherein said potential of said memory cell source wire is slowly reduced after said second switching transistor turns on, and erase verify starts, when said first switching transistor turns on.

6. A non-volatile semiconductor memory device comprising:

a memory cell array composed of plural electrically erasable and programmable memory cells, first and second switching transistors connected with a memory cell source wire and a ground plane in parallel with each other, a current-driving capability of said first switching transistor being higher than that of said second switching transistor, wherein a high potential is applied to a memory cell source wire, while said memory cells are being erased, means for making said second switching transistor turn on at a point of time that said application of said high potential to said memory cell source wire is stopped, and means for making said first switching transistor turn on at a point of time that said potential of said memory cell source wire becomes equal to a predetermined value, wherein said potential of said memory cell source wire is slowly reduced after said second switching transistor turns on, and erase verify starts, when said first switching transistor turns on.

* * * * *